US011640984B2

(12) United States Patent
Kavalieros et al.

(10) Patent No.: US 11,640,984 B2
(45) Date of Patent: May 2, 2023

(54) TRANSISTOR DEVICE WITH (ANTI)FERROELECTRIC SPACER STRUCTURES

(71) Applicant: Intel Corporation, Santa Clara, CA (US)

(72) Inventors: Jack Kavalieros, Portland, OR (US);
Ian Young, Portland, OR (US);
Matthew Metz, Portland, OR (US);
Uygar Avci, Portand, OR (US);
Chia-Ching Lin, Portland, OR (US);
Owen Loh, Portland, OR (US); Seung Hoon Sung, Portland, OR (US); Aditya Kasukurti, Hillsboro, OR (US);
Sou-Chi Chang, Portland, OR (US);
Tanay Gosavi, Hillsboro, OR (US);
Ashish Verma Penumatcha, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 888 days.

(21) Appl. No.: 16/363,952

(22) Filed: Mar. 25, 2019

(65) Prior Publication Data
US 2020/0312978 A1 Oct. 1, 2020

(51) Int. Cl.
*H01L 29/51* (2006.01)
*H01L 29/78* (2006.01)

(52) U.S. Cl.
CPC .......... *H01L 29/516* (2013.01); *H01L 29/785* (2013.01)

(58) Field of Classification Search
CPC .......................... H01L 29/516; H01L 29/785
See application file for complete search history.

(56) References Cited

U.S. PATENT DOCUMENTS

2019/0103474 A1\* 4/2019 Toh .................... H01L 29/66795
2019/0115441 A1\* 4/2019 Tan ..................... H01L 29/6656

\* cited by examiner

*Primary Examiner* — Daniel P Shook
(74) *Attorney, Agent, or Firm* — Essential Patents Group, LLP

(57) ABSTRACT

Techniques and mechanisms for providing electrical insulation or other protection of an integrated circuit (IC) device with a spacer structure which comprises an (anti)ferromagnetic material. In an embodiment, a transistor comprises doped source or drain regions and a channel region which are each disposed in a fin structure, wherein a gate electrode and an underlying dielectric layer of the transistor each extend over the channel region. Insulation spacers are disposed on opposite sides of the gate electrode, where at least a portion of one such insulation spacer comprises an (anti) ferroelectric material. Another portion of the insulation spacer comprises a non-(anti)ferroelectric material. In another embodiment, the two portions of the spacer are offset vertically from one another, wherein the (anti)ferroelectric portion forms a bottom of the spacer.

17 Claims, 9 Drawing Sheets

TRANSISTOR DEVICE WITH (ANTI)FERROELECTRIC SPACER STRUCTURES

BACKGROUND

1. Technical Field

Embodiments of the invention relate generally to non-planar semiconductor devices that provide a spacer structure which is ferroelectric or anti-ferroelectric. Methods of manufacturing such devices are also described.

2. Background Art

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices formed from germanium-based material systems offer exceptionally high hole (or electron) mobility in the transistor channels due to low effective mass along with reduced scattering and increased velocity. Such devices provide high drive current performance and appear promising for future low power, high speed logic applications.

Additionally, in the manufacture of integrated circuit devices, multi-gate transistors, such as tri-gate transistors, or gate-all-around devices, such as nanowires, have become more prevalent as device dimensions continue to scale down. A FinFET is one type of non-planar transistor which is built around a thin strip of semiconductor material (referred to as the "fin"). The transistor includes the standard field effect transistor (FET) nodes/components: a gate, a gate dielectric, a source region, and a drain region. During operation, a conductive channel of the device resides on the outer sides of the fin beneath the gate dielectric. Specifically, current runs along "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

Many different techniques have been attempted to improve, or at least maintain, various transistor performance characteristics which would otherwise be compromised as next-generation devices continue to scale in size. The mitigation of current leakage is an increasingly significant aspect of these efforts.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
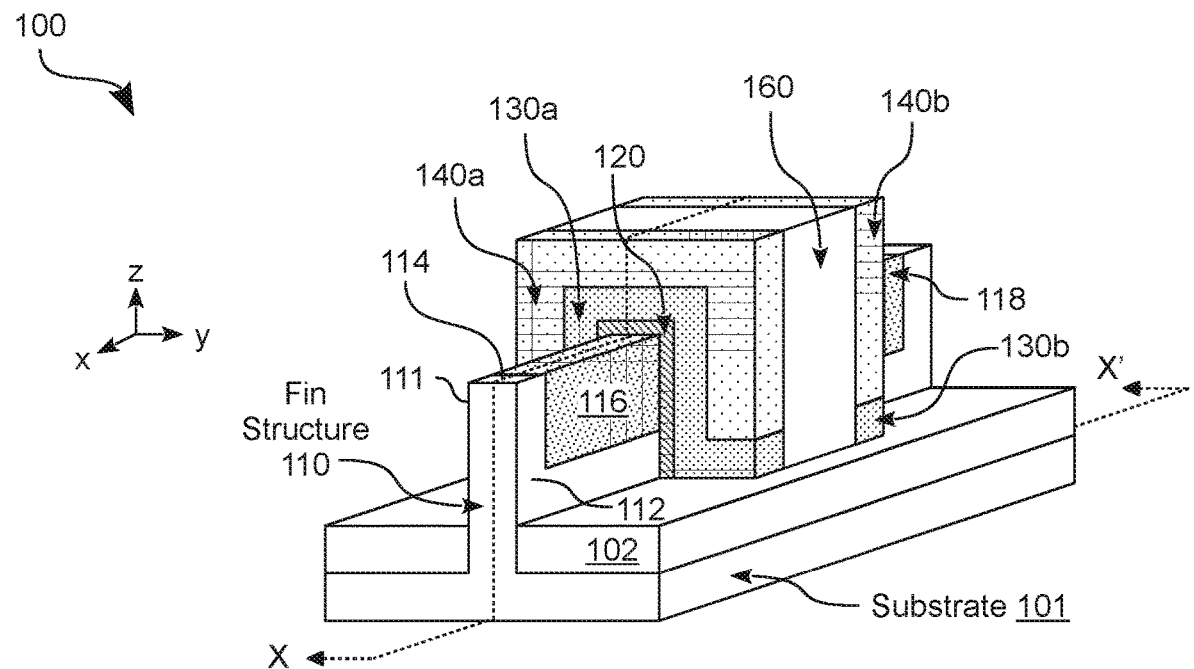
FIG. 1 shows a perspective view of an integrated circuit including ferroelectric or anti-ferroelectric spacer structures according to an embodiment.
Figure 1:
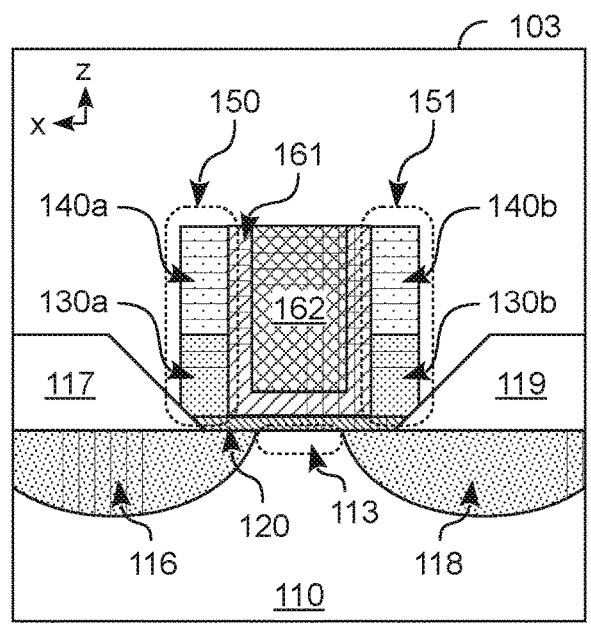

Embodiments discussed herein variously provide techniques and mechanisms for electrical insulating and/or otherwise protecting an integrated circuit (IC) device—such as a transistor or a diode—with a spacer structure which includes a ferroelectric or anti-ferroelectric material. With respect to a given spacer structure (and/or a material of said spacer structure), the term "(anti)ferroelectric" is used herein to refer to the characteristic of the spacer structure exhibiting either ferroelectric properties or anti-ferroelectric properties—e.g., wherein the spacer structure comprises either one of a ferroelectric material or an anti-ferroelectric material In modern transistor designs, band bending conditions at an end of a channel region (e.g., near a drain region of the transistor) results in leakage current which is commonly referred to as Gate Induced Drain Leakage (GIDL). For example, channel regions comprising III-V or Ge materials have relatively high off-current due in part to GIDL. Traditional techniques to mitigate such off-current have various trade-offs—e.g., where the use of a higher band gap material in a source or drain (SD) structure often contributes to external resistance, which degrades on-current performance. By providing an (anti)ferroelectric spacer structure, embodiments variously help prevent or otherwise reduce Gate Induced Drain Leakage (GIDL), while—for example—mitigating the need to reduce supply voltage and/or transistor on-current.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including one or more non-planar IC devices.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single transistor.

It is pointed out that those elements of the figures having the same reference numbers (or names) as the elements of any other figure can operate or function in any manner similar to that described, but are not limited to such.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors-BJT PNP/NPN, BiCMOS, CMOS, etc., may be used for some transistors without departing from the scope of the disclosure.

FIG. 1 is a perspective view of an integrated circuit (IC) device 100, according to an embodiment, which comprises a non-planar semiconductor device including at least one gate formed on at least one fin structure. IC device 100 is one example of an embodiment wherein structures of a transistor, diode or other such device are variously disposed in or on a fin structure. Although structures of IC device 100 are variously shown as having respective rectilinear geometries, in various embodiments some or all such structures—including structures of the non-planar geometries—instead have curved, obliquely angled, tapered and/or otherwise non-rectilinear shapes.

FIG. 1 shows one example of a portion of an IC device 100 consistent with the present disclosure, in this case a portion of a FinFET. As shown, IC device 100 includes a substrate 101, a trench dielectric 102 on substrate 101, and a fin structure 110 disposed in a trench which is formed by trench dielectric 102. Fin structure 110 comprises, for example, a top surface 114 and a pair of laterally opposite sidewalls (sidewall 111 and opposing sidewall 112, respectively). In some embodiments, portions of fin structure 110 which are vertically offset from one another comprise different respective III-V (and/or other) semiconductor materials.

Substrate 101 is formed of any of a variety of materials that are suitable for use as a substrate of a semiconductor device, and in particular as a substrate for non-planar transistors such as FinFETS and multi-gate transistors. Non-limiting examples of such suitable materials include silicon (Si), germanium (Ge), silicon-germanium (SiGe), silicon-carbide (SiC), sapphire, a III-V semiconductor, a silicon on insulate (SOI) substrate, combinations thereof, and the like. Without limitation, in some embodiments substrate 101 is formed from or includes single crystal silicon.

In some embodiments, one or more underlayers (not illustrated) are deposited on substrate 101, e.g., such that they are present between substrate 101 and one or more of trench dielectric 102 and the materials forming fin structure 110. For example, one or more semiconductor base layers are deposited on substrate 101, in some embodiments. When used, such base layers may be pseudomorphic, metamorphic, or substantially lattice matched buffer and/or transition layers, as understood in the art. In any case, substrate 101 is thus able to provide an epitaxial seeding surface (e.g., a crystalline surface having a (100) or other suitable orientation) for the subsequent deposition of the materials of fin structure 110.

In the embodiment of IC device 100, a trench (not separately labeled) is defined by the sidewalls of trench dielectric 102 (hereinafter, trench sidewalls) and an upper portion of substrate 101. A trench of any of a variety of suitable dimensions may be used, in different embodiments, according to implementation-specific details. Without limitation, in some embodiments the height (z-axis dimension) and width (y-axis dimension) of the trench enables the deposition of the materials used to form fin structure 110. Accordingly, in some embodiments the width of the trench is in a range of 1 nanometers (nm) to 500 nanometers (nm), such as in a range of 1 nm to 300 nm, in a range of 1 nm to 100 nm, in a range of 5 nm to 100 nm, or even in a range of 5 nm to 30 nm. Likewise, the height of such a trench is range, for example, in a range of 1 nm to 500 nm, such as a range of 100 nm to 300 nm.

Trench dielectric 102 is formed from any of a variety of materials that are suitable for use as a trench dielectric material of a non-planar semiconductor device. Non-limiting examples of such materials include oxides, nitrides and alloys, such as but not limited to silicon oxide ($SiO_2$), silicon nitride (SiN), silicon oxycarbide (SiCO), silicon carbon oxynitride (SiCON), silicon carbonitride (SiCN), combinations thereof, and the like. Without limitation, in some embodiments trench dielectric 102 is $SiO_2$. In more general terms, in some embodiments the non-planar semiconductor device includes a substrate and at least one trench that is formed on or within the substrate. Such a trench is defined by at least two opposing sides (trench sidewalls) and a bottom. A bottom of the trench is formed at least in part by an upper surface of the substrate, and/or one or more buffer and/or transition layers deposited on the substrate.

A non-planar transistor of IC device 100 comprises structures which are variously disposed in or on fin structure 110. For example, such a non-planar transistor includes a channel region 113 of fin structure 110 and two doped source or drain ("SD") structures 116, 118 at opposite ends thereof—e.g., wherein fin structure 110 includes each of doped SD structures 116, 118 and channel region 113. Such transistor structures further comprise, for example, raised SD epitaxial (epi) structures 117, 119 formed, respectively, on doped SD structures 116, 118. A layer 120 and a gate structure 160 of the non-planar transistor variously extend over channel region 113—e.g., wherein layer 120 is to serve as at least part of a gate dielectric which provides electrical insulation between gate structure 160 and each of top surface 114 and sidewalls 111, 112. Layer 120 includes, for example, any appropriate dielectric material, including, but not limited to, silicon dioxide, doped silicon dioxide, silicon nitride, doped silicon oxide, low-k dielectrics, such as polyimide, polynorbornenes, benzocyclobutene, and polytetrafluoroethylene, and the like.

An inset 103 in FIG. 1 shows a view of a cross-section X-X' of IC device 100. As illustrated in inset 103, gate structure 160 comprises a gate electrode 162 which extends over and across a portion of fin structure 110 in a region between insulation spacers 150, 151 (which also extend over and across fin structure 110). Gate structure 160 is shown in inset 103 as further comprising an additional layer 161 of dielectric material which is to provide further electrical insulation of gate electrode 162. However, gate structure 160 omits any such layer 161, in other embodiments.

In some advantageous embodiments, gate electrode 162 includes a metal with a work function below 5 eV. The metal gate electrode 162 includes, for example, an elemental metal layer, a metal alloy layer, or laminate structure of either or both. In some embodiments the gate electrode 162 is a metal nitride, such as TiN (e.g., 4.0-4.7 eV). The gate electrode 162 may additionally or alternatively comprise Al (e.g., TiAlN) and/or silicon (TiSiO), for example. Other alloy constituents may also be employed, such as, but not limited to C, Ta, W, Pt, and Zn. While any of various suitable insulator materials may be utilized in layer 161, in one exemplary embodiment a high-k material having a bulk relative permittivity of 9, or more, is employed. Exemplary high-k gate dielectric materials include metal oxides, such as, but not limited to $Al_2O_3$, $HfO_2$, $HfAlO_x$, $HfSiO_x$, $HfZrO$, $ZrO$, $LaHfZrO$, $LaHfO$, or $TaSiO_x$ may also be suitable.

In an embodiment, operation of IC device 100 includes selectively controlling a current—between source or drain regions 116, 118 via channel region 113—by variously applying voltages each to a respective one of gate electrode 162, and SD epi structures 117, 119. This operation is enabled in part by layer 120 (and in some embodiments, layer 161) functioning as a gate dielectric structure to provide electrical insulation between gate electrode 162 and channel region 113.

Certain embodiments variously improve such operation—by a transistor, diode or other suitable IC device—by providing an (anti)ferroelectric portion of a spacer structure such as one of insulation spacers 150, 151. Such an (anti)ferroelectric portion mitigates GIDL and/or other sources of transistor off-current, in some embodiments. In the example embodiment shown, insulation spacer 150 comprises a spacer portion 130a which comprises an (anti)ferroelectric material—e.g., where another spacer portion 140a of insulation spacer 150 comprises a different material that, for example, is a dielectric other than any (anti)ferroelectric material. Alternatively or in addition, insulation spacer 151 comprises a spacer portion 130b which comprises an (anti)ferroelectric material—e.g., where another spacer portion 140b of insulation spacer 151 comprises a different material.

One or both of spacer portions 130a, 130b comprise (for example) hafnium, oxygen, and one of zirconium, aluminum, silicon, yttrium, scandium, lanthanum, nitrogen, or molybdenum. In one such embodiment, spacer portions 130a, 130b each comprise hafnium oxide doped with zirconium, aluminum, silicon, yttrium, scandium, lanthanum, nitrogen, or molybdenum. In another embodiment, spacer portions 130a, 130b comprise zirconium and oxygen. In some embodiments, spacer portions 130a, 130b comprise oxygen, one of lutetium, bismuth, lead, barium, lanthanum, or strontium, and one of iron, titanium, cobalt, tantalum, niobium, ruthenium, or zinc. However, either or both of spacer portions 130a, 130b comprise any of a variety of suitable (anti)ferroelectric materials, in different embodiments.

As illustrated in inset 103, spacer portion 130a is offset vertically from spacer portion 140a—e.g., where spacer portion 130b is offset vertically from spacer portion 140b. In one illustrative embodiment, spacer portion 130a forms a bottom portion of insulation spacer 150—e.g., where a total vertical (z-axis) span of spacer structure 330a is in a range of 5% to 80% (for example, in a range of 10% to 50% and, in some embodiments, in a range of 10% to 30%) of the total vertical span of insulation spacer 150. Alternatively or in addition, spacer portion 130b forms a bottom portion of insulation spacer 151—e.g., where a total vertical span of spacer structure 330b is in a range of 5% to 80% (for example, in a range of 10% to 50% and, in some embodiments, in a range of 10% to 30%) of the total vertical span of insulation spacer 151.

In other embodiments, an (anti)ferroelectric portion of an insulation spacer is offset horizontally from another—e.g., non-(anti)ferroelectric—portion of that insulation spacer. Alternatively or in addition, an insulation spacer (in some embodiments) comprises a non-(anti)ferroelectric spacer portion between two (anti)ferroelectric spacer portions, and/or an (anti)ferroelectric spacer portion between two non-(anti)ferroelectric spacer portions.

Figure 2:
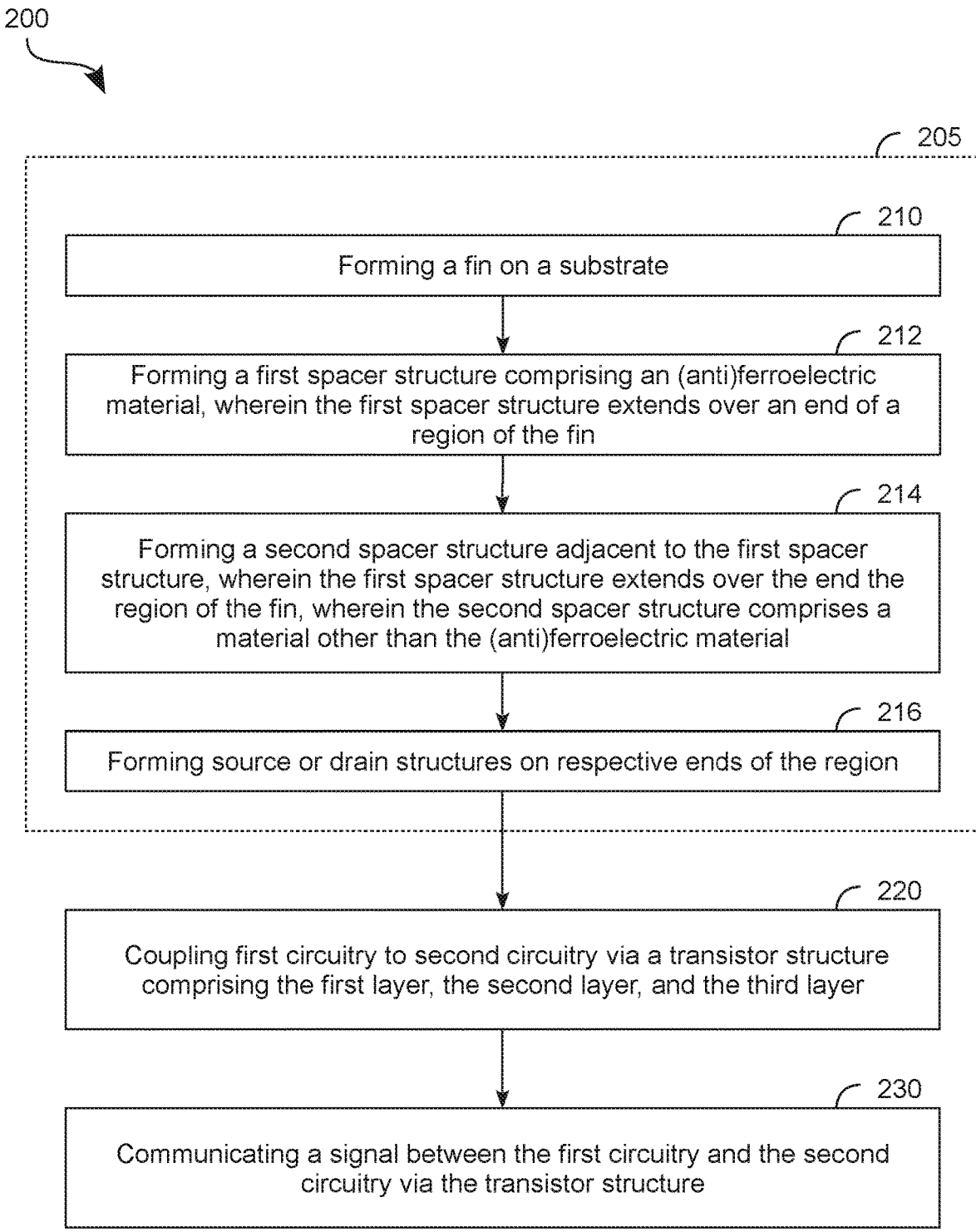
FIG. 2 illustrates a flow diagram illustrating elements of a method to fabricate structures of a non-planar semiconductor device according to an embodiment.

FIG. 2 shows features of a method 200, according to an embodiment, to provide functionality of an IC device—e.g., configured to provide transistor functionality—which includes (anti)ferroelectric spacer structures extending over a semiconductor fin structure. Method 200 is an example of processes to fabricate, interconnect and/or operate structures such as those of IC device 100, for example. To illustrate certain features of various embodiments, method 200 is described herein with reference to structures shown in FIGS. 3A through 3C. However, any of a variety of additional or alternative structures may be fabricated according to method 200, in different embodiments.

As shown in FIG. 2, method 200 comprises (for example) operations 205 to fabricate an IC structure at least in part. Such operations 205 include, for example, forming a channel region in a fin structure (i.e., a region which is to function as a channel during operation of the IC structure), and forming spacers which extend over the fin structure on opposite respective sides of the channel region. A respective portion of at least one such spacer comprises an (anti)ferroelectric material.

Figure 3A:
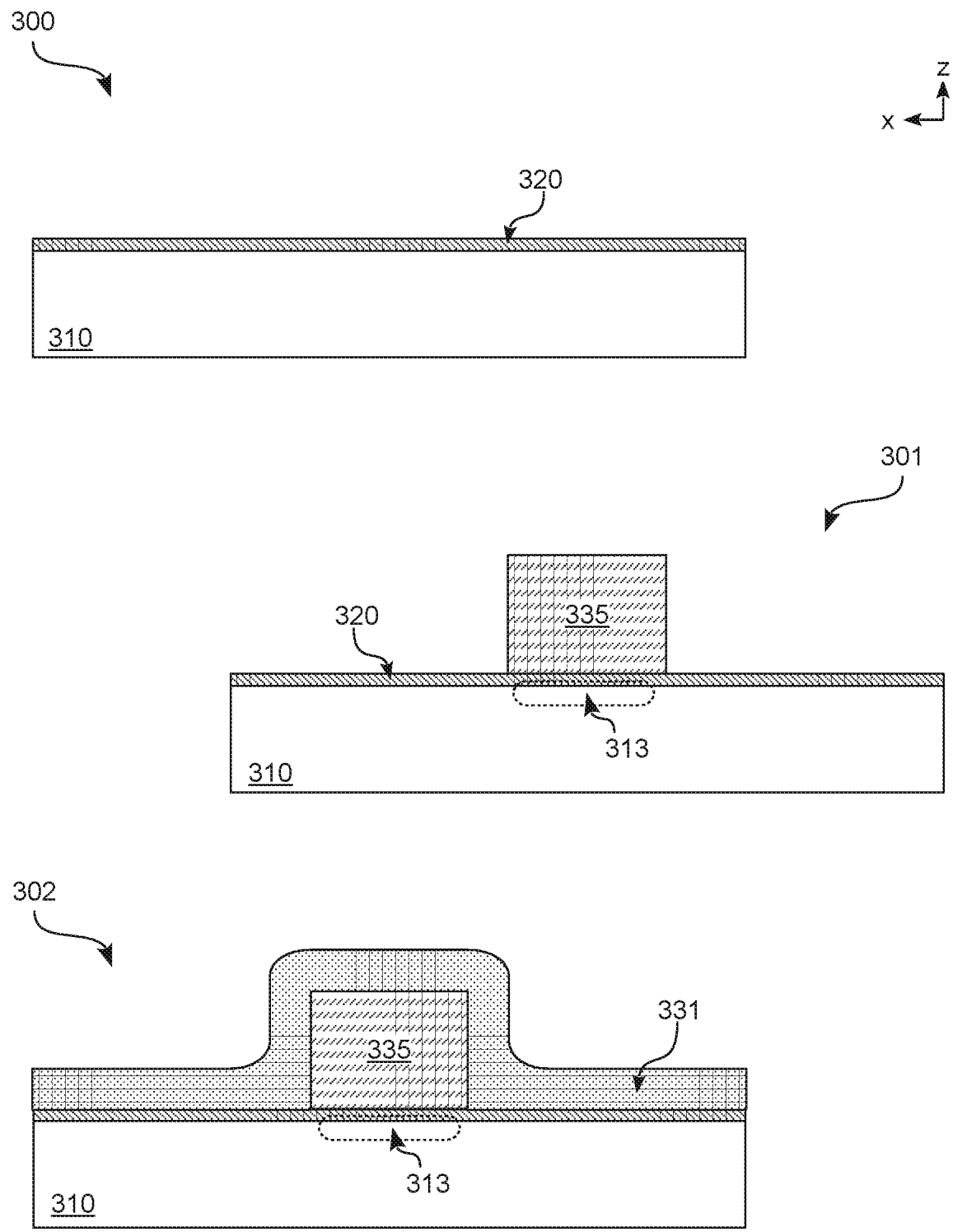
FIGS. 3A through 3C show various perspective and cross-sectional views each of a respective stage of processing to fabricate ferroelectric or anti-ferroelectric spacer structures of a non-planar semiconductor device according to an embodiment.
Figure 3B:
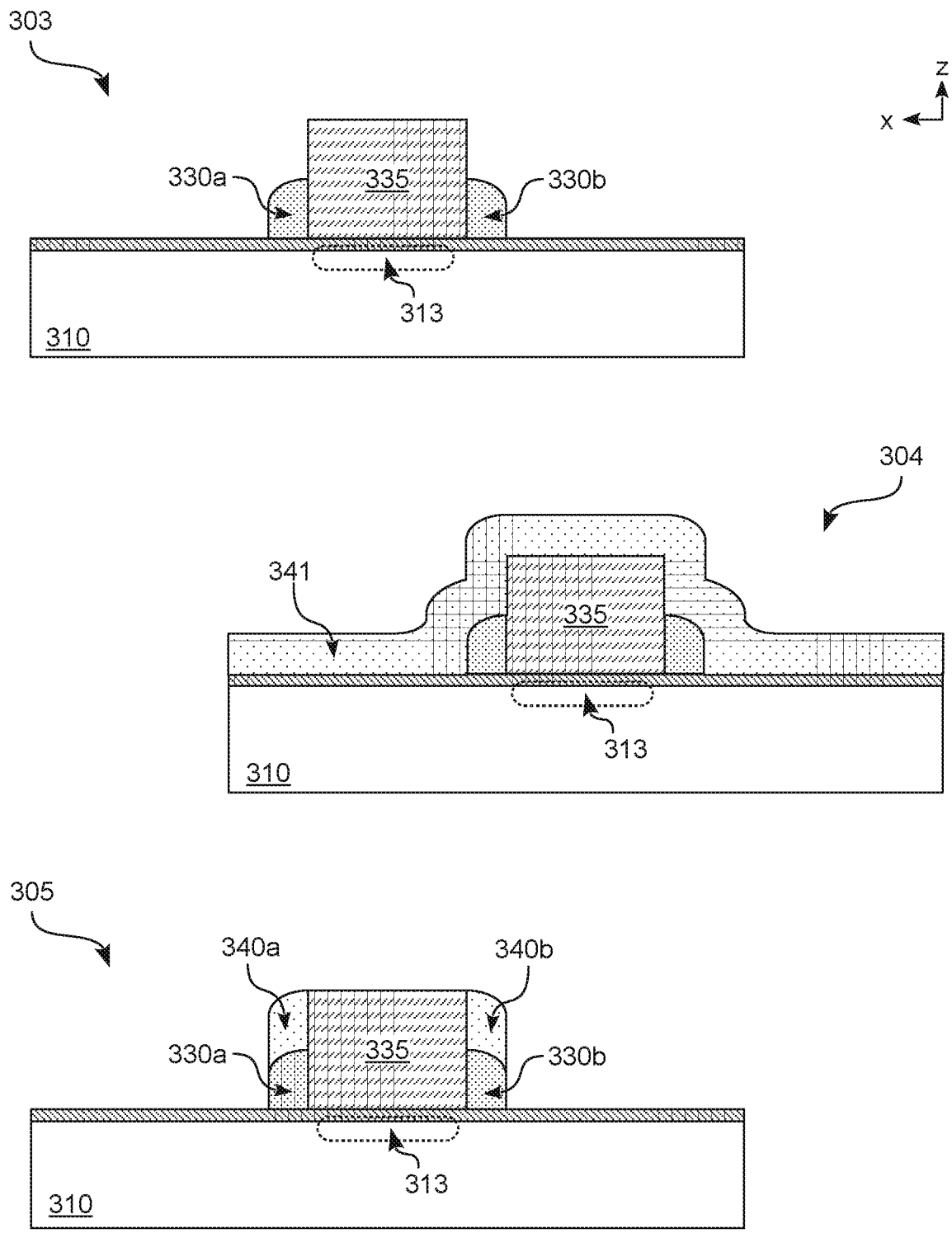
Figure 3C:
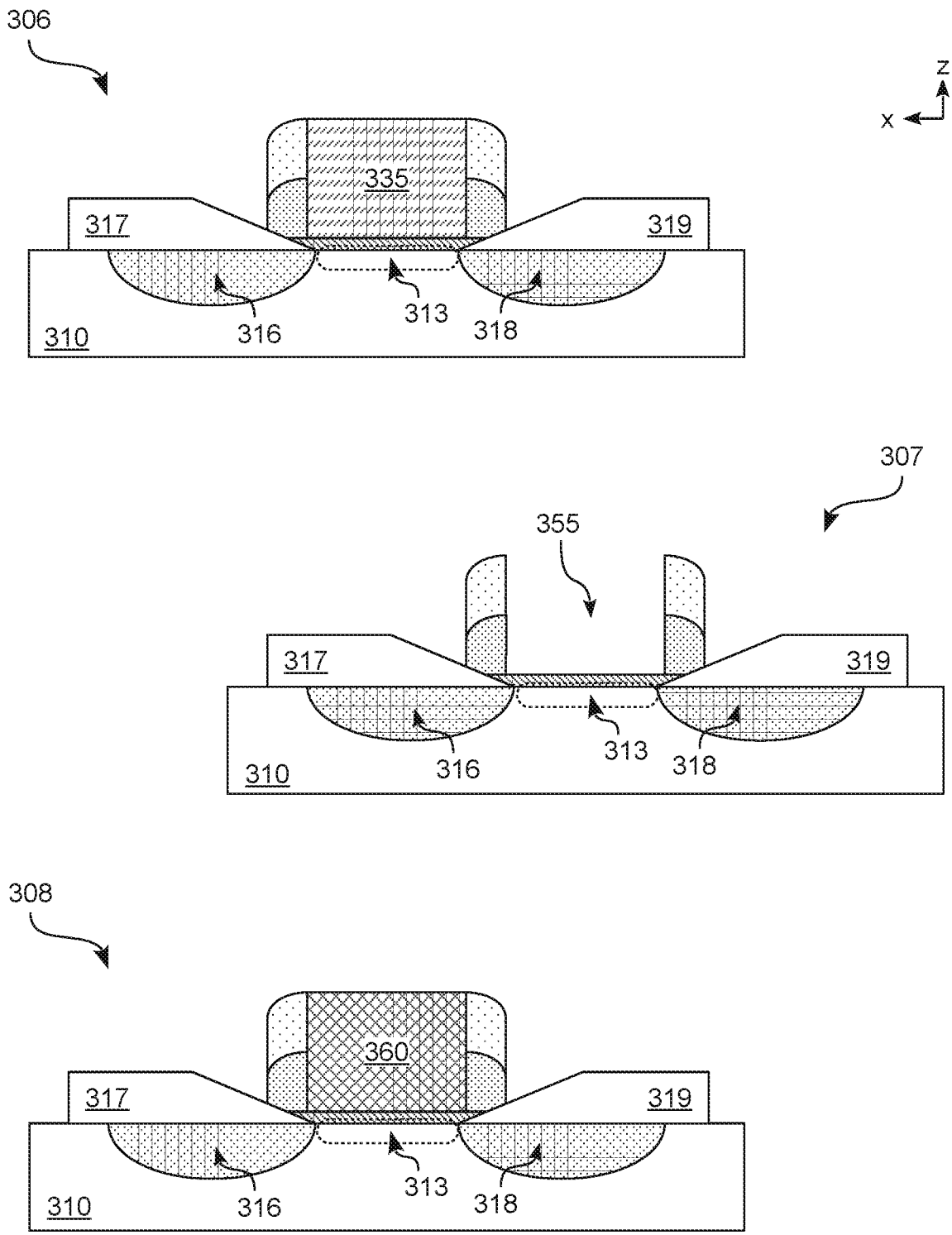

By way of illustration and not limitation, operations 205 comprise (at 210) forming a fin structure on a substrate, wherein the fin structure comprises a semiconductor material. Referring now to FIGS. 3A through 3C, cross-sectional views variously show structures at respective stages 300-308 of processing to fabricate an IC device according to an embodiment. For each of stages 300-308, FIGS. 3A-3C show respective cross-sectional views which, for example, correspond to the cross-section X-X' of IC device 100.

As shown at stage 300, a fin 310 extends vertically from a semiconductor substrate—e.g., through a trench (not shown) which is formed at least in part by a trench dielectric such as trench dielectric 102. Fin 310 includes some or all of the features of fin structure 110, for example. In an embodiment, fin 310 has a vertical span in a range of 10 nm to 200 nm. However, such dimensions vary according to implementation-specific details, in different embodiments. In some embodiments, formation of fin 310 (e.g., at 210) includes operations that are adapted from conventional semiconductor processing techniques.

Referring again to FIG. 2, operations 205 further comprise (at 212) forming a first spacer structure comprising an (anti)ferroelectric material, wherein the first spacer structure extends over one end of a region of the fin structure. The first spacer structure has features of one of spacer portions 130a, 130b, for example. In an embodiment, the spacer structure is formed on, or otherwise adjacent to, a layer (such as layer 120, for example) of a dielectric material that is to provide electrical insulation in a transistor structure which is to be fabricated with operations 205. In some embodiments, an average thickness of the layer is equal to or less than 40 Angstroms (Å) thick—e.g., in a range of 5 Å to 40 Å and, in some embodiments, in a range of 5 Å to 20 Å. However, such dimensions may vary according to implementation-specific details, in different embodiments. In an embodiment, formation of such a gate dielectric layer includes any of a variety of additive processes (such as chemical vapor deposition, atomic layer deposition or the like) adapted, for example, from conventional semiconductor fabrication techniques.

For example, at stage 300, a layer 320 is formed to extend—e.g., along a y-axis orthogonal to the cross-section shown—across and over at least a portion of fin 310. Layer 320 provides features and functionality of layer 120, for example. At least a portion of layer 320—e.g., a portion which is adjacent to, and conformal with, some of fin 310—is to provide at least part of a gate dielectric structure. Formation of layer 320 comprises deposition of a dielectric material that, for example, comprises silicon and one of oxygen, nitrogen, or carbon—e.g., wherein the dielectric material is one of silicon oxides ($SiO_2$), silicon oxynitrides (SiON), silicon nitrides (SiN), silicon carbonitrides (SiCN), carbon-doped oxide (SiOC), or combinations thereof. However, in other embodiments, layer 320 includes any of a variety of suitable materials that are adapted from convention techniques for providing electrical insulation for non-planar transistors.

In some embodiments, forming the first spacer structure at 212 includes, or is otherwise based on, a formation of one or more dummy (i.e., sacrificial) structures which are to confine at least in part the extent of one or more spacer structures. For example, referring now to FIG. 3B, stage 302 illustrates formation of a dummy gate 335. A portion of fin 310 which is under dummy gate 335 is to provide a channel region 313 of a transistor structure (or other such IC device) which is fabricated with operations 205.

Dummy gate 335 includes a layer of material such as a doped polysilicon, for example. In an example embodiment, formation of dummy gate 335 includes forming a patterned resist mask (not shown) on layer 330 and depositing a dummy gate material through the patterned resist mask. Any of a variety of known mask, patterning, deposition and/or etch methods and techniques can be used to form dummy gate 335, in various embodiments.

In some embodiments, a bottom portion of dummy gate 335 includes, or is disposed on, a layer of a dummy gate dielectric material (not shown) which is deposited on layer 330. Such a dummy gate dielectric layer includes, for example, a layer of material such as but not limited to silicon dioxide or silicon carbide. Other embodiments omit any such dummy gate dielectric layer between layer 330 and dummy gate 335.

Subsequently, one or more (anti)ferroelectric spacer structures are formed—e.g., wherein two spacer structures are formed each at a different respective sidewall of dummy gate 335. In the example embodiment shown, a layer 331 is formed, at stage 302, by blanket depositing of an (anti) ferroelectric material which is conformal to a top surface and sidewalls of fin 310. Layer 331 comprises (for example) hafnium, oxygen, and one of zirconium, aluminum, silicon, yttrium, scandium, lanthanum, nitrogen, or molybdenum. In one such embodiment, layer 331 comprises, for example, hafnium oxide which is doped with zirconium, aluminum, silicon, yttrium, scandium, lanthanum, nitrogen, or molybdenum. In another embodiment, layer 331 comprises zirconium and oxygen—e.g., where layer 331 comprises zirconium dioxide ($ZrO_2$). In some embodiments, layer 331 comprises oxygen, one of lutetium, bismuth, lead, barium, lanthanum, or strontium, and one of iron, titanium, cobalt, tantalum, niobium, ruthenium, or zinc. In one such embodiment, layer 331 includes any of a variety of compounds of the type $ABO_3$, where A is one of lutetium, bismuth, lead, barium, lanthanum, or strontium, and where B is one of iron, titanium, cobalt, tantalum, niobium, ruthenium, or zinc. By way of illustration and not limitation, layer 331 comprises, for example, lead titanate, barium titanate, barium strontium titanate (BST), lead zirconate titanate (PZT), lead magnesium niobate-lead titanate (PMN-PT) or combinations thereof. However, layer 331 comprises any of a variety of suitable (anti)ferroelectric materials, in different embodiments.

The (anti)ferroelectric material of layer 331 is deposited, for example, in a conformal manner so that an (anti) ferroelectric film forms to substantially equal heights on vertical surfaces, such as the sidewalls of dummy gate 335. In one exemplary embodiment, the (anti)ferroelectric layer 331 is a film formed by a hot-wall low-pressure chemical vapor deposition (LPCVD) process, by atomic layer deposition process (ALD), or the like. In one example embodiment, such an (anti)ferroelectric film is formed to a thickness which is equal to or less than 200 Angstroms (Å) thick—e.g., where the thickness is in a range of 20 Å to 200 Å and, in some embodiments, in a range of 20 Å to 100 Å.

In one such embodiment, forming the first spacer structure at 212 further comprises selectively etching or otherwise removing portions of an (anti)ferroelectric material layer—e.g., where at least some remaining (anti)ferroelectric material adjoins a dummy gate. For example, as shown at stage 303, etching of layer 331 through a patterned mask (not shown) results in the formation of (anti)ferroelectric spacer structures 330a, 330b which are each disposed over fin structure 310 on opposite respective sides of dummy gate 335. In one such embodiment, (anti)ferroelectric spacer structures 330a, 330b each extend partially up a respective sidewall of dummy gate 335.

Operations 205 further comprises (at 214) forming a second spacer structure adjacent to the first spacer structure, wherein the second spacer structure extends over the same end of the region of the fin, wherein the second spacer structure comprises a material other than the (anti)ferroelectric material. The second spacer structure has features of one of spacer portions 140a, 140b, for example.

For example, as shown at stage 304, a layer 341 if formed—e.g., by blanket depositing of a dielectric material which is conformal to exposed surfaces such as those of dummy gate 335, (anti)ferroelectric spacer structures 330a, 330b, and/or the like.

In an embodiment, layer 341 is deposited as a conformal film of a dielectric material, such as, but not limited to, silicon nitride, silicon oxide, silicon oxynitride or combinations thereof. In some embodiments, a dielectric material of layer 341 is deposited in a conformal manner so that a dielectric film forms to substantially equal heights on various surfaces. In one exemplary embodiment, the dielectric film is a silicon nitride film formed by ALD, or the like.

In one such embodiment, forming the second spacer structure at 214 further comprises selectively etching or otherwise removing portions of layer 341—e.g., where at least some remaining dielectric material remains on one or both of (anti)ferroelectric spacer structures 330a, 330b. For example, as shown at stage 305, etching of layer 341 through a patterned mask (not shown) results in the formation of one or both of spacer structures 340a, 340b—e.g., where spacer structures 340a, 340b are on (anti)ferroelectric spacer structures 330a, 330b, respectively, and on opposite respective ends of dummy gate 335.

In some embodiments, spacer structures 330a, 340a are offset vertically from one another along one sidewall of dummy gate 335—e.g., wherein spacer structures 330b, 340b are offset vertically from one another along an opposite sidewall of dummy gate 335. Accordingly, spacer structures 330a, 340a form at least in part a first insulation spacer (such as spacer 151)—e.g., wherein spacer structure 330a forms a bottom portion of said first insulation spacer. In an example embodiment, a total vertical (z-axis) span of (anti)ferroelectric spacer structure 330a is in a range of 5% to 80% (e.g., in a range of 10% to 50% and, in some embodiments, in a range of 10% to 30%) of such a first insulation spacer.

Similarly, spacer structures 330b, 340b form at least in part a second insulation spacer (such as spacer 151)—e.g., wherein spacer structure 330b forms a bottom portion of said second insulation spacer. In an example embodiment, a total vertical (z-axis) span of (anti)ferroelectric spacer structure 330a is in a range of 5% to 80% (e.g., in a range of 10% to 50% and, in some embodiments, in a range of 10% to 30%) of such a first insulation spacer.

Operations 205 further comprises (at 216) forming source or drain structures—and/or other transistor structures, in various embodiments—on opposite respective sides of the region. For example, in some embodiments, processing such as that illustrated by stages 300-308 (e.g., including operations 205) comprises additional fabrication to form various other transistor structures while dummy gate 335 is disposed over channel region 313. As illustrated at stage 306, such additional fabrication comprises, for example, forming doped source or drain regions 316, 318 in portions of fin 310 which are on opposite respective sides of channel region 313. Other transistor structures formed by the additional fabrication include, for example, raised epitaxial source or drain regions 317, 319 extending over doped source or drain regions 316, 318 (respectively), source or drain contact structures (not shown), and/or the like. Such additional fabrication includes processes that, for example, are adapted from conventional mask, patterning, etching, deposition, doping, polishing, and/or other techniques (which are not detailed herein to avoid obscuring certain features of various embodiments).

In some embodiments, transistor structures formed by operations 205 further comprise a gate structure. By way of illustration, as shown at stage 307, dummy gate 335 is etched or otherwise removed—e.g., after the formation of some or all of doped source or drain regions 316, 318 and raised epitaxial source or drain regions 317, 319. Removal of dummy gate 335 exposes a region 355 which is defined at least in part by respective side surfaces of (anti)ferroelectric spacer structures 330a, 330b, and spacer structures 340a, 340b, and—for example—by a remaining portion of layer 320. Subsequently, as shown at stage 308, a gate electrode structure 360 is formed in region 355—e.g., using operations adapted from conventional metallization and/or other deposition techniques. The particular shape and size of gate electrode structure 360 is merely illustrative, and not limiting on some embodiments.

As illustrated at stage 308, some embodiments provide two vertically offset (and horizontally aligned) spacer structures 330a, 340a at one side of gate electrode structure 360—e.g., where two spacer structures 330a, 340a are at an opposite side of gate electrode structure 360. However, other embodiments variously provide one or more spacers each comprising a respective three or more vertically offset structures—e.g., each such spacer including multiple (anti)ferromagnetic material structures which are interleaved with one or more non-(anti)ferromagnetic material structures.

In some embodiments, method 200 additionally or alternatively includes operations to connect and/or operate an integrated circuit such as that which is produced by operations 205. For example, method 200 comprises (at 220) coupling first circuitry to second circuitry via a transistor structure which comprises the first spacer structure and the second spacer structure. Alternatively or in addition, method 200 comprises (at 230) communicating a signal between the first circuitry and the second circuitry via the transistor structure.

Figure 4A:
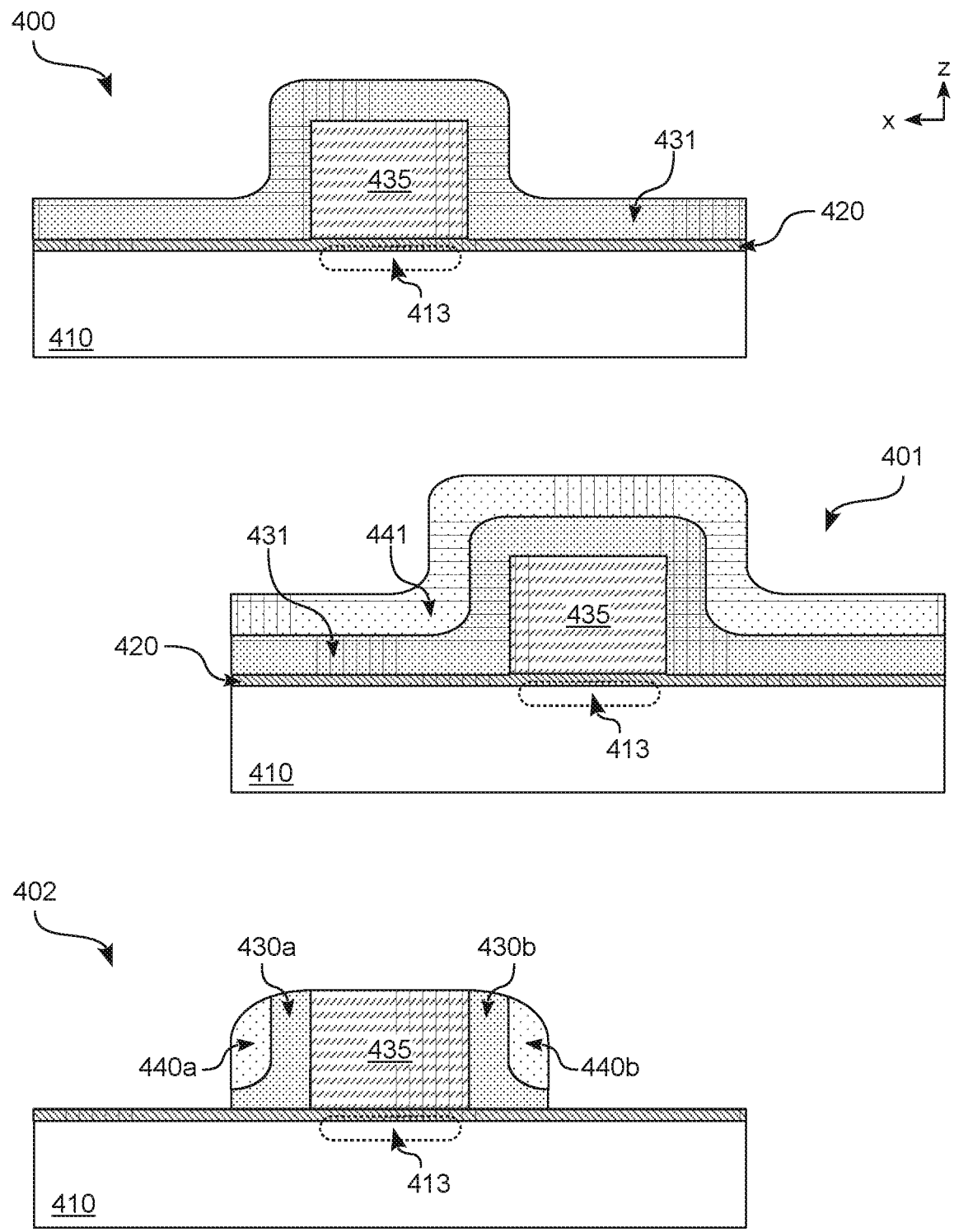
FIGS. 4A through 4B show various perspective and cross-sectional views each of a respective stage of processing to fabricate ferroelectric or anti-ferroelectric spacer structures of a non-planar semiconductor device according to an embodiment.
Figure 4B:
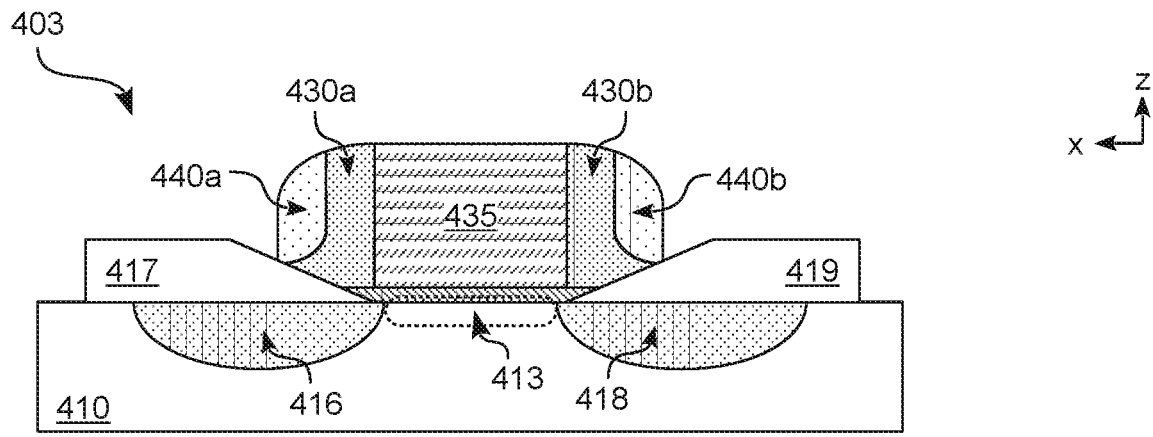
Figure 4B:
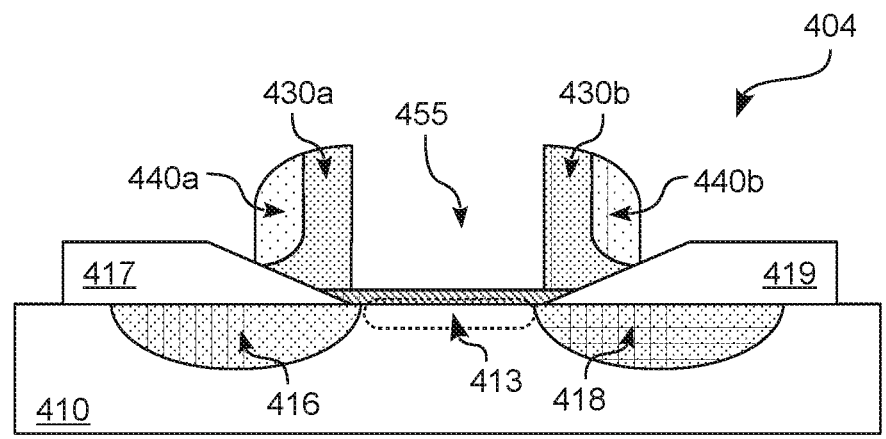
Figure 4B:
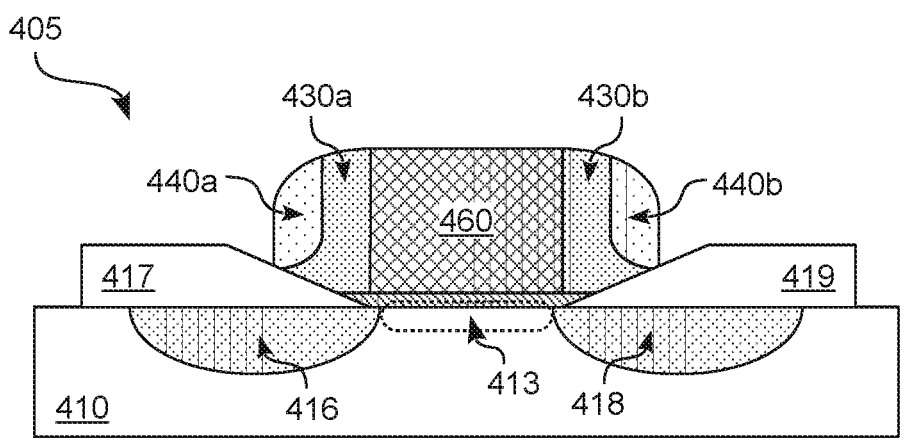

FIGS. 4A, 4B show cross-sectional views for respective stages 400-405 of processing to fabricate an IC device according to another embodiment. Processing such as that represented by stages 400-405 provides an (anti)ferroelectric portion of a spacer that is offset horizontally from another—e.g., non-(anti)ferroelectric—portion of said spacer. Such processing fabricates structures which (for example) have features of IC device 100—e.g., wherein such processing includes some or all of operations 205.

For each of stages 400-405, FIGS. 4A, 4B show respective transverse (x-z plane) cross-sectional views. In the example embodiment shown, structures formed at stage 400 are similar to those formed at stage 302—e.g., wherein a layer 420 of a dielectric material extends over and across a fin structure 410 (such as fin structure 110), where a dummy gate 435 is formed extends over and across fin 410 and layer 420, and where another layer 431 of an (anti)ferroelectric material extends conformally over dummy gate 435 and portions of layer 420. In some embodiments, layer 420, dummy gate 435, and layer 431 have respective features of layer 320, dummy gate 335, and layer 331.

As shown at stage 401, a layer 441 if formed—e.g., by blanket depositing silicon nitride, silicon oxide, or any of a variety of other suitable dielectric materials—to extend conformally over a portion of layer 431 which, itself, extends conformally over dummy gate 435. Layer 441 is a silicon nitride (or other dielectric) film formed, for example, by ALD, in some embodiments. Subsequently, etching and/or other subtractive processing is performed to remove respective portions of layers 431, 441 other than at least some portions which extend along sidewalls of dummy gate 435.

For example, as shown at stage 402, etching through a patterned mask (not shown) removes portions of layers 431, 441, resulting in the formation of one or both of (anti)ferroelectric structure 430a, 430b, and one or both of dielectric structure 440a, 440b. Accordingly, a first insulation spacer and a second insulation spacer are formed on opposite sides of dummy gate 435—e.g., wherein the first insulation spacer comprises (anti)ferroelectric structure 430a, and non-(anti)ferroelectric structure 440a, and wherein the second insulation spacer comprises (anti)ferroelectric structure 430b, and non-(anti)ferroelectric structure 440b.

In some embodiments, at least some portions of spacer structures 430a, 440a extend vertically alongside one another—e.g., where portions of spacer structures 430b, 440b similarly extend vertically alongside one another. In an example embodiment, part of (anti)ferroelectric spacer structure 430a has a total horizontal (x-axis) span which is in a range of 5% to 80% (e.g., in a range of 10% to 50% and, in some embodiments, in a range of 10% to 30%) of the total horizontal span of the first insulation spacer. Alternatively or in addition, part of (anti)ferroelectric spacer structure 430b has a total horizontal (x-axis) span which is in a range of 5% to 80% (e.g., in a range of 10% to 50% and, in some embodiments, in a range of 10% to 30%) of the total horizontal span of the second insulation spacer.

In some embodiments, processing such as that illustrated by stages 400-405 comprises additional fabrication to form various transistor structures while dummy gate 435 is disposed over channel region 413. As illustrated at stage 403, such additional fabrication comprises, for example, forming doped source or drain regions 416, 418 in portions of fin 410 which are on opposite respective sides of channel region 413. Other transistor structures formed by the additional fabrication include, for example, raised epitaxial source or drain regions 417, 419 extending over doped source or drain regions 416, 418 (respectively). Such additional fabrication includes processes that, for example, are adapted from conventional mask, patterning, etching, deposition, doping, polishing, and/or other techniques (which are not detailed herein to avoid obscuring certain features of various embodiments).

As shown at stage 404, dummy gate 435 is etched or otherwise removed—e.g., after the formation of some or all of doped source or drain regions 416, 418 and raised epitaxial source or drain regions 417, 419. Removal of dummy gate 435 exposes a region 455 which is defined at least in part by respective side surfaces of (anti)ferroelectric spacer structures 430a, 430b, and spacer structures 440a, 440b, and—for example—by a remaining portion of layer 420. Subsequently, as shown at stage 405, a gate electrode structure 460 is formed in region 455—e.g., using operations adapted from conventional metallization and/or other deposition techniques. The particular shape and size of gate electrode structure 460 is merely illustrative, and not limiting on some embodiments.

As illustrated at stage 405, some embodiments provide two spacer structures 430a, 440a which extend vertically alongside one another at one side of gate electrode structure 460—e.g., where two spacer structures 430a, 440a extend vertically alongside one another at an opposite side of gate electrode structure 460. However, other embodiments variously provide one or more spacers each comprising a respective three or more structures which extend vertically alongside one another—e.g., each such spacer including multiple (anti)ferromagnetic material structures which are interleaved with one or more non-(anti)ferromagnetic material structures.

Figure 5:
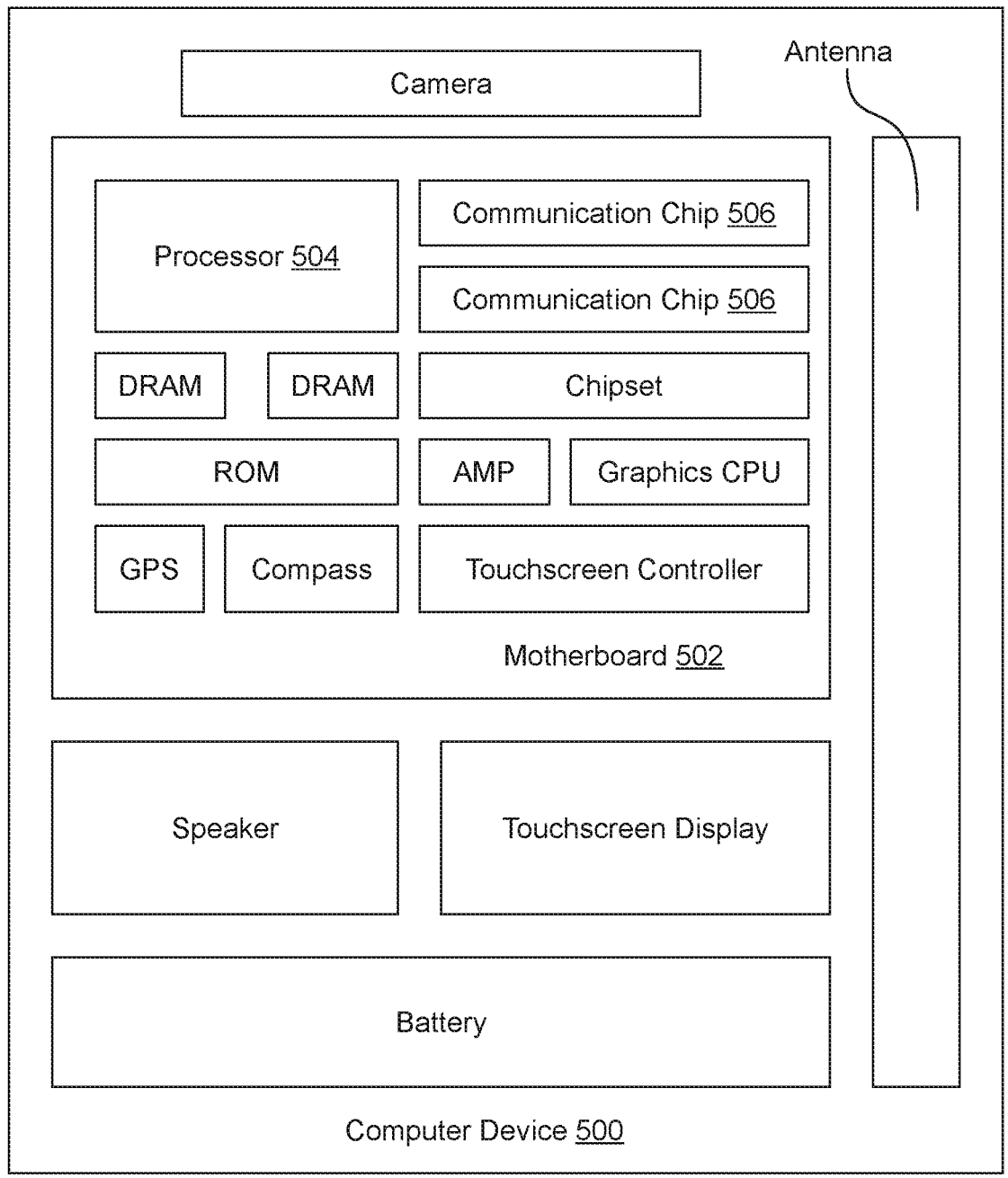
FIG. 5 illustrates a functional block diagram illustrating a computing device in accordance with one embodiment.

FIG. 5 illustrates a computing device 500 in accordance with one embodiment. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touch-screen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. The term "processor" may refer to any device or portion of a device that processes electronic data from registers and/or memory to transform that electronic data into other electronic data that may be stored in registers and/or memory. The communication chip 506 also includes an integrated circuit die packaged within the communication chip 506.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
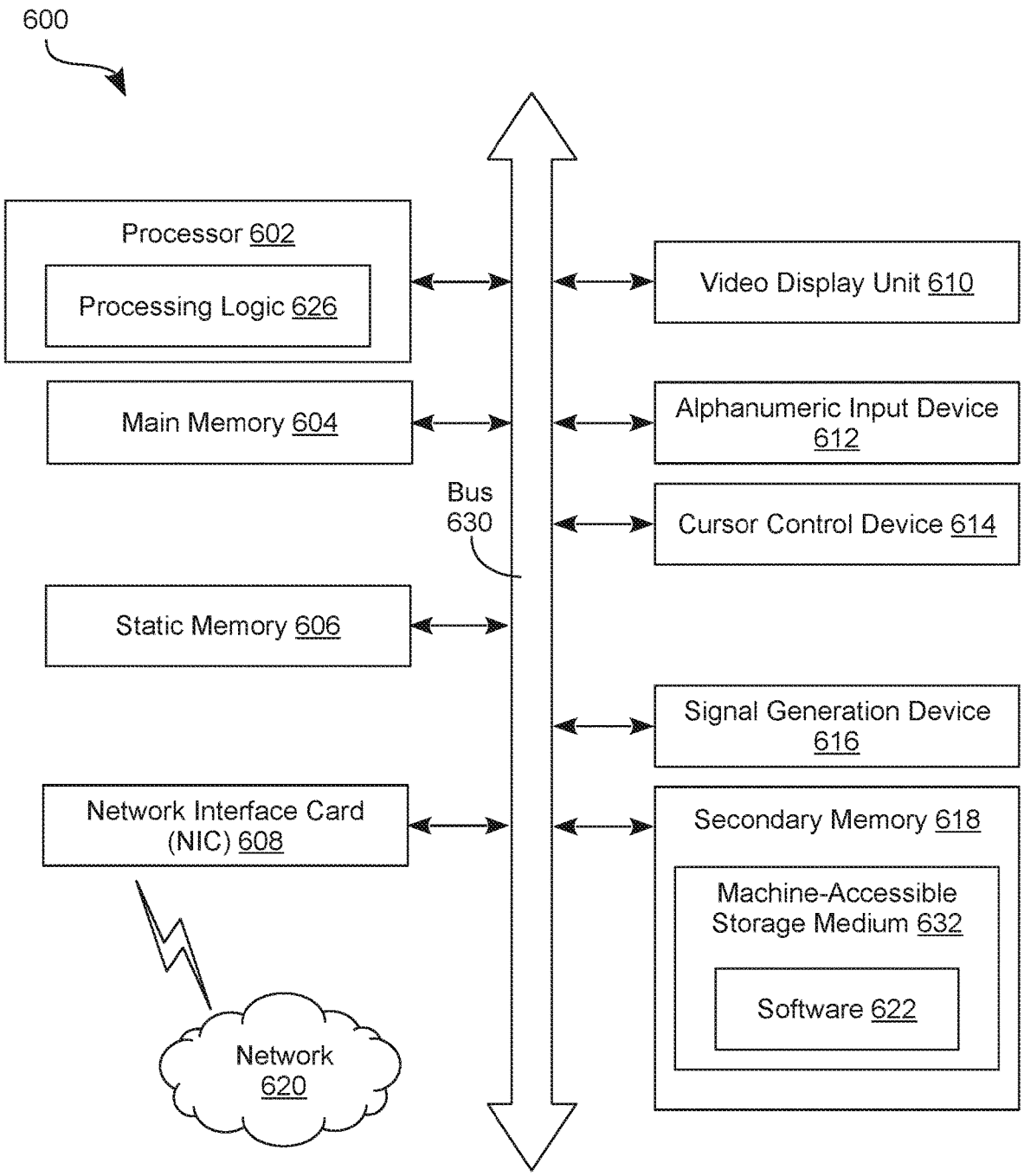
FIG. 6 illustrates a functional block diagram illustrating an exemplary computer system, in accordance with one embodiment.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for mitigating leak current of an integrated circuit device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) device comprising:
   a fin structure comprising doped source or drain regions, and a channel region between the doped source or drain regions;
   a layer on the channel region, the layer comprising a dielectric material;
   spacers which each extend over a different respective one of the doped source or drain regions, the spacers comprising a first spacer which comprises:
     a first portion comprising a ferroelectric or anti-ferroelectric material; and
     a second portion comprising a material other than the ferroelectric or anti-ferroelectric material, wherein the first portion is offset vertically from the second portion; and
   a gate electrode which extends over the layer in a region between the spacers.

2. The IC device of claim 1, wherein the first spacer comprises multiple ferroelectric or anti-ferroelectric portions which are interleaved with one or more other portions.

3. The IC device of claim 1, wherein the first portion extends vertically alongside the second portion.

4. The IC device of claim 3, wherein the first spacer comprises multiple ferroelectric or anti-ferroelectric portions which are interleaved with one or more other portions.

5. The IC device of claim 1, wherein the first portion forms a bottom of the first spacer.

6. The IC device of claim 1, wherein a total vertical span of the first portion is in a range of 5% to 80% of a total vertical span of the first spacer.

7. The IC device of claim 6, wherein the total vertical span of the first portion is in a range of 10% to 50% of the total vertical span of the first spacer.

8. The IC device of claim 1, wherein the ferroelectric or anti-ferroelectric material comprises hafnium, oxygen, and one of zirconium, aluminum, silicon, yttrium, scandium, lanthanum, nitrogen, or molybdenum.

9. The IC device of claim 1, wherein the ferroelectric or anti-ferroelectric material comprises:
   oxygen;
   one of lutetium, bismuth, lead, barium, lanthanum, or strontium; and
   one of iron, titanium, cobalt, tantalum, niobium, ruthenium, or zinc.

10. The IC device of claim 9, wherein the ferroelectric or anti-ferroelectric material comprises a compound ABO3, where A is one of lutetium, bismuth, lead, barium, lanthanum, or strontium, and where B is one of iron, titanium, cobalt, tantalum, niobium, ruthenium, or zinc.

11. An integrated circuit (IC) device comprising:
    doped source or drain regions of a transistor;
    a channel region of the transistor, the channel region disposed between the doped source or drain regions; and
    spacers which each extend over a different respective one of the doped source or drain regions, the spacers comprising a first spacer which comprises:
      a first portion comprising a ferroelectric or anti-ferroelectric material; and
      a second portion comprising a material other than the ferroelectric or anti-ferroelectric material, wherein the first portion is offset vertically from the second portion.

12. The IC device of claim 11, wherein the first portion forms a bottom of the first spacer.

13. The IC device of claim 11, wherein a total vertical span of the first portion is in a range of 5% to 80% of a total vertical span of the first spacer.

14. The IC device of claim 11, wherein the ferroelectric or anti-ferroelectric material comprises hafnium, oxygen, and one of zirconium, aluminum, silicon, yttrium, scandium, lanthanum, nitrogen, or molybdenum.

15. The IC device of claim 11, wherein the ferroelectric or anti-ferroelectric material comprises:
    oxygen;
    one of lutetium, bismuth, lead, barium, lanthanum, or strontium; and
    one of iron, titanium, cobalt, tantalum, niobium, ruthenium, or zinc.

16. A system comprising:
    an integrated circuit (IC) device comprising:
      a transistor structure comprising:
        a fin structure comprising doped source or drain regions, and a channel region between the doped source or drain regions;
        a layer on the channel region, the layer comprising a dielectric material;
        spacers which each extend over a different respective one of the doped source or drain regions, the spacers comprising a first spacer which comprises:
          a first portion comprising a ferroelectric or anti-ferroelectric material; and
          a second portion comprising a material other than the ferroelectric or anti-ferroelectric material, wherein the first portion is offset vertically from the second portion; and
        a gate electrode which extends over the layer in a region between the spacers; and
    a display device coupled to the IC device, the display device to display an image based on a signal communicated with the transistor structure.

17. The system of claim 16, wherein the ferroelectric or anti-ferroelectric material comprises hafnium, oxygen, and one of zirconium, aluminum, silicon, yttrium, scandium, lanthanum, nitrogen, or molybdenum.

* * * * *